(12) United States Patent
Lee

(10) Patent No.: US 9,778,682 B2
(45) Date of Patent: Oct. 3, 2017

(54) DISPLAY APPARATUS AND PORTABLE TERMINAL

(71) Applicant: Samsung Display Co., Ltd., Yongin-si, Gyeonggi-do (KR)

(72) Inventor: Sangwol Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/176,135

(22) Filed: Jun. 7, 2016

(65) Prior Publication Data

US 2017/0038798 A1 Feb. 9, 2017

(30) Foreign Application Priority Data

Aug. 5, 2015 (KR) .................... 10-2015-0110728

(51) Int. Cl.
| | |
|---|---|
| *G06F 1/16* | (2006.01) |
| *G09F 9/30* | (2006.01) |
| *H04M 1/02* | (2006.01) |
| *H05K 5/00* | (2006.01) |
| *H05K 1/02* | (2006.01) |

(52) U.S. Cl.
CPC .......... *G06F 1/1616* (2013.01); *G06F 1/1641* (2013.01); *G09F 9/301* (2013.01); *H04M 1/0268* (2013.01); *H05K 1/028* (2013.01); *H05K 5/0021* (2013.01)

(58) Field of Classification Search
CPC ...... G06F 1/1616; G06F 1/1641; G09F 9/301; H05K 5/0021; H05K 1/028; H04M 1/0268
See application file for complete search history.

(56) References Cited

U.S. PATENT DOCUMENTS

| | | | |
|---|---|---|---|
| 8,804,317 B2* | 8/2014 | Watanabe ........... | G02F 1/13336 345/1.1 |
| 8,804,349 B2* | 8/2014 | Lee ....................... | G06F 1/1641 361/679.01 |
| 9,572,272 B2* | 2/2017 | Lee ..................... | H04M 1/0216 |
| 2006/0146488 A1* | 7/2006 | Kimmel ............... | G06F 1/1616 361/679.04 |

(Continued)

FOREIGN PATENT DOCUMENTS

| | | |
|---|---|---|
| KR | 10-0945481 B1 | 3/2010 |
| KR | 10-2012-0117140 A | 10/2012 |

(Continued)

*Primary Examiner* — Adrian S Wilson
*Assistant Examiner* — Abhishek Rathod
(74) *Attorney, Agent, or Firm* — Lewis Roca Rothgerber Christie LLP

(57) ABSTRACT

A display apparatus includes a first base plate, a second base plate coupled to the first base plate to allow the second base plate to be rotated on the basis of a rotation axis between the first base plate and the second base plate, a moving plate coupled to the second base plate and configured to slide along a first direction with respect to the second base plate, a pop-up plate configured to move along a second direction corresponding to a thickness direction of the second base plate on the second base plate in accordance with a movement of the moving plate, and a display panel including a first portion coupled to the first base plate and a second portion coupled to the moving plate.

19 Claims, 6 Drawing Sheets

(56) References Cited

U.S. PATENT DOCUMENTS

| | | | |
|---|---|---|---|
| 2012/0264489 A1* | 10/2012 | Choi | H04M 1/0216 |
| | | | 455/566 |
| 2013/0016460 A1* | 1/2013 | Yeh | G06F 1/1679 |
| | | | 361/679.01 |
| 2013/0021762 A1* | 1/2013 | van Dijk | G06F 1/1652 |
| | | | 361/749 |
| 2013/0058063 A1* | 3/2013 | O'Brien | G06F 1/1624 |
| | | | 361/807 |
| 2015/0233162 A1* | 8/2015 | Lee | H04M 1/02 |
| | | | 16/223 |

FOREIGN PATENT DOCUMENTS

| | | |
|---|---|---|
| KR | 10-1292974 B1 | 8/2013 |
| KR | 10-2014-0014669 A | 2/2014 |

* cited by examiner

DISPLAY APPARATUS AND PORTABLE TERMINAL

CROSS-REFERENCE TO RELATED APPLICATIONS

This U.S. non-provisional patent application claims, under 35 U.S.C. §119, priority to and benefit of Korean Patent Application No. 10-2015-0110728, filed on Aug. 5, 2015, the contents of which are hereby incorporated by reference in its entirety.

BACKGROUND

1. Field

Aspects of embodiments of the present invention relate to a display apparatus and a portable terminal. More particularly, aspects of embodiments of the present invention relate to a foldable display apparatus and a portable terminal.

2. Description of the Related Art

In recent years, a curved or folded display panel (hereinafter, referred to as a flexible display module) has been developed. The flexible display module includes a flexible display panel and a variety of functional members. The flexible display panel includes a base member, a variety of functional layers disposed on the base member, and pixels disposed on the base member. A rollable display apparatus or a foldable display apparatus includes the flexible display module.

SUMMARY

Aspects of embodiments of the present invention provide a display apparatus having a length that is compensable when the display apparatus is folded.

Aspects of embodiments of the present invention provide a portable terminal having the display apparatus.

According to one embodiment of the present invention, a display apparatus includes a first base plate, a second base plate coupled to the first base plate to allow the second base plate to be rotated on the basis of a rotation axis between the first base plate and the second base plate, a moving plate coupled to the second base plate and configured to slide along a first direction with respect to the second base plate, a pop-up plate configured to move along a second direction corresponding to a thickness direction of the second base plate on the second base plate in accordance with a movement of the moving plate, and a display panel including a first portion coupled to the first base plate and a second portion coupled to the moving plate.

The display apparatus may further include an elastic member between the pop-up plate and the second base plate.

The second base plate may include a first groove configured to accommodate the elastic member, and the pop-up plate may include a second groove configured to accommodate the elastic member.

The moving plate may include a base portion coupled to the second portion, a first wing portion protruding from a first side surface of the base portion, and a second wing portion protruding from a second side surface of the base portion, the first wing portion and the second wing portion being spaced apart from each other along a third direction crossing the first direction, and the second base plate may include an accommodating portion configured to accommodate the wing portion.

The pop-up plate may include a first upper surface having a width corresponding to a first length along the first direction, a first bottom surface facing the first upper surface and having a width corresponding to a second length greater than the first length along the first direction, three first side surfaces substantially perpendicular to the first upper surface and connecting the first upper surface and the first bottom surface, and a first inclined surface connecting the first upper surface and the first bottom surface.

The first length may be equal to or greater than a value obtained by multiplying a shortest distance between the rotation axis and the display panel by pi (π).

The moving plate may include a second upper surface coupled to the second portion and having a width corresponding to a third length along the first direction, a second bottom surface facing the second upper surface and having a width corresponding to a fourth length smaller than the third length along the first direction, three second side surfaces substantially perpendicular to the second upper surface and connecting the second upper surface and the second bottom surface, and a second inclined surface connecting the second upper surface and the second bottom surface, and a first angle between the first inclined surface and the first bottom surface is substantially equal to a second angle between the second inclined surface and the second upper surface.

A corner at which one side surface among the first side surfaces, which faces the first inclined surface, may be connected to the first bottom surface has a round shape.

The second base plate may include a bottom portion on which the pop-up plate and the moving plate are disposed and a sidewall portion extending in the second direction from the bottom portion, and the bottom portion may include a stepped portion defined therein to accommodate the pop-up plate.

The second base plate may further include a protrusion portion protruding from an inner surface of the sidewall portion and the first upper surface of the pop-up plate may include a recess formed therein to accommodate the protrusion portion.

The bottom portion may include an exposure portion that is exposed when the moving plate moves when the second base plate rotates.

One base plate of the first and second base plates may have a substantially cylindrical shape elongated in a third direction crossing the first direction, the other base plate of the first and second base plates may include a second coupling portion coupled to both ends of the first coupling portion, which are spaced apart from each other in the third direction, and a third portion of the display panel, which is defined between the first and second portions, may be wound around the first coupling portion in accordance with a rotation of the second base plate.

The moving plate may have a first strength and the pop-up plate may have a second strength smaller than the first strength.

When a case that a rotation angle of the second base plate is 0 and the display panel is flat is referred to as a first state and a case that the rotation angle of the second base plate is 180 and the display panel is folded is referred to as a second state, the moving plate may slide toward the rotation axis while the second base plate rotates from the first state to the second state.

The pop-up plate may be pressed down and the moving plate may slide above the pop-up plate while the second base plate rotates to the second state from the first state.

According to one embodiment of the present invention, a portable terminal including a display panel deformed from one state to another state among a first state in which the display panel is flat and a second state in which the display panel is folded, a first base plate coupled to a first portion of the display panel, a moving plate coupled to a second portion of the display panel, the second portion being spaced apart from the first portion along a first direction, a pop-up plate configured to support a third portion of the display panel when the display panel is in the first state, the third portion of the display being between the first and second portions, and a second base plate coupled to the first base plate and configured to be rotated relative to the first base plate, the second base plate being sliding-coupled to the moving plate and configured to accommodate the pop-up plate.

The moving plate may be configured to slide toward the pop-up plate and the pop-up plate may be configured to be accommodated in the second base plate by the moving plate when the state of the display panel is changed from the first state to the second state.

The pop-up plate may include a first inclined surface contacting a second inclined surface of the moving plate when the display panel is in the first state, the first inclined surface may have an incline at a first angle with respect to a bottom surface of the pop-up plate, the second inclined surface may have an incline at a second angle with respect to an upper surface of the moving plate, and each of the first and second angles may be an acute angle.

The pop-up plate may be disposed between the moving plate and the second base plate when the display panel is in the second state.

The third portion may be bent at a first radius of curvature when the display panel is in the second state, and a width in the first direction of the third portion is equal to or greater than a value obtained by multiplying the first radius of curvature by pi ($\pi$) when the display panel is in the first state.

According to the above, the stress applied to the display panel, which is caused when the display apparatus and the portable terminal are folded, may be reduced.

BRIEF DESCRIPTION OF THE DRAWINGS

The above and other advantages of embodiments of the present invention will become readily apparent by reference to the following detailed description when considered in conjunction with the accompanying drawings wherein.

DETAILED DESCRIPTION

Figure 1:
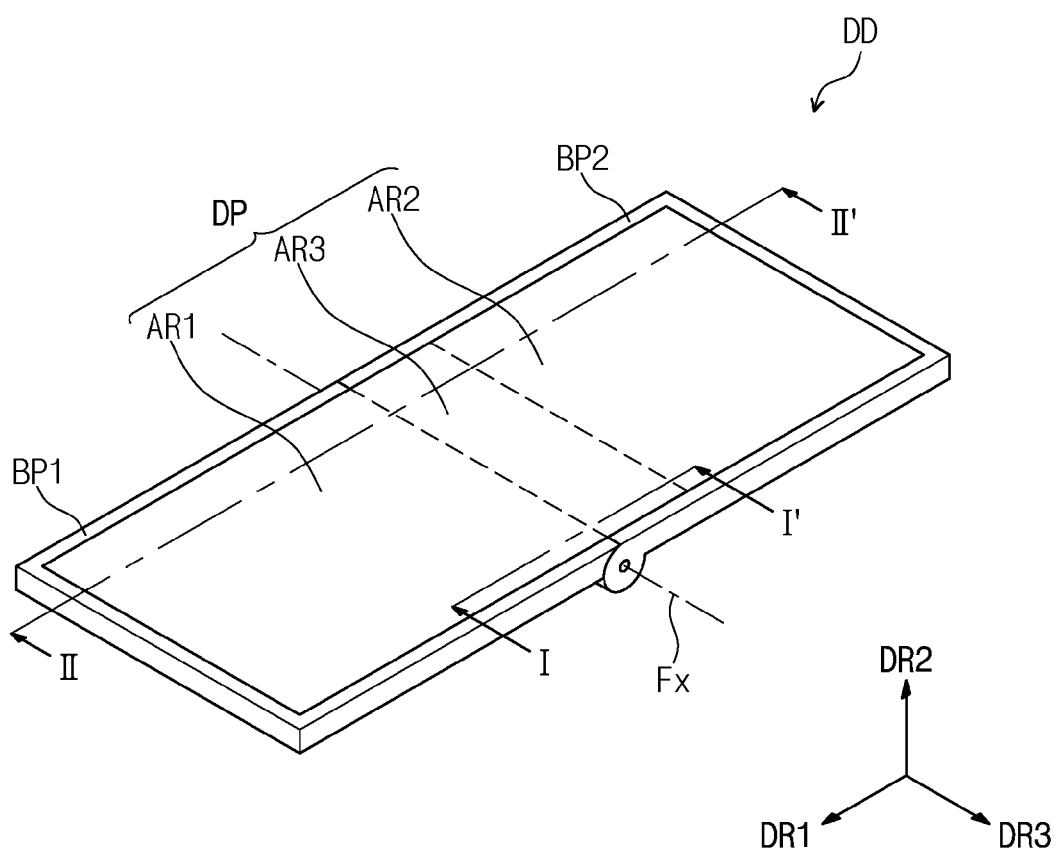
FIG. 1 is a perspective view showing a display apparatus according to an example embodiment of the present invention.

Hereinafter, example embodiments of the present invention will be described with reference to accompanying drawings. In the following description, the same reference numerals will be assigned to elements and structures identical to those of the related art and detailed description thereof will be omitted in order to avoid redundancy. Although the example embodiments of the present invention have been described, it is understood that the present invention should not be limited to these example embodiments but various changes and modifications can be made by one ordinary skilled in the art within the spirit and scope of the present invention as hereinafter claimed.

Hereinafter, the present invention will be explained in detail with reference to the accompanying drawings.

FIG. 1 is a perspective view showing a display apparatus DD according to an example embodiment of the present invention.

FIG. 1 shows a foldable portable terminal as the display apparatus DD, but the display apparatus DD should not be limited thereto or thereby. For example, the display apparatus DD may be applied to a large-sized electronic item, such as a foldable television set, etc., and a small and medium-sized electronic item, such as a personal computer, a notebook computer, a personal digital assistant (PDA), a game unit, a mobile electronic device, a wrist-type electronic device (e.g., a smart wristwatch), a camera, etc., but embodiments of the present invention are not limited thereto or thereby.

Figure 2:
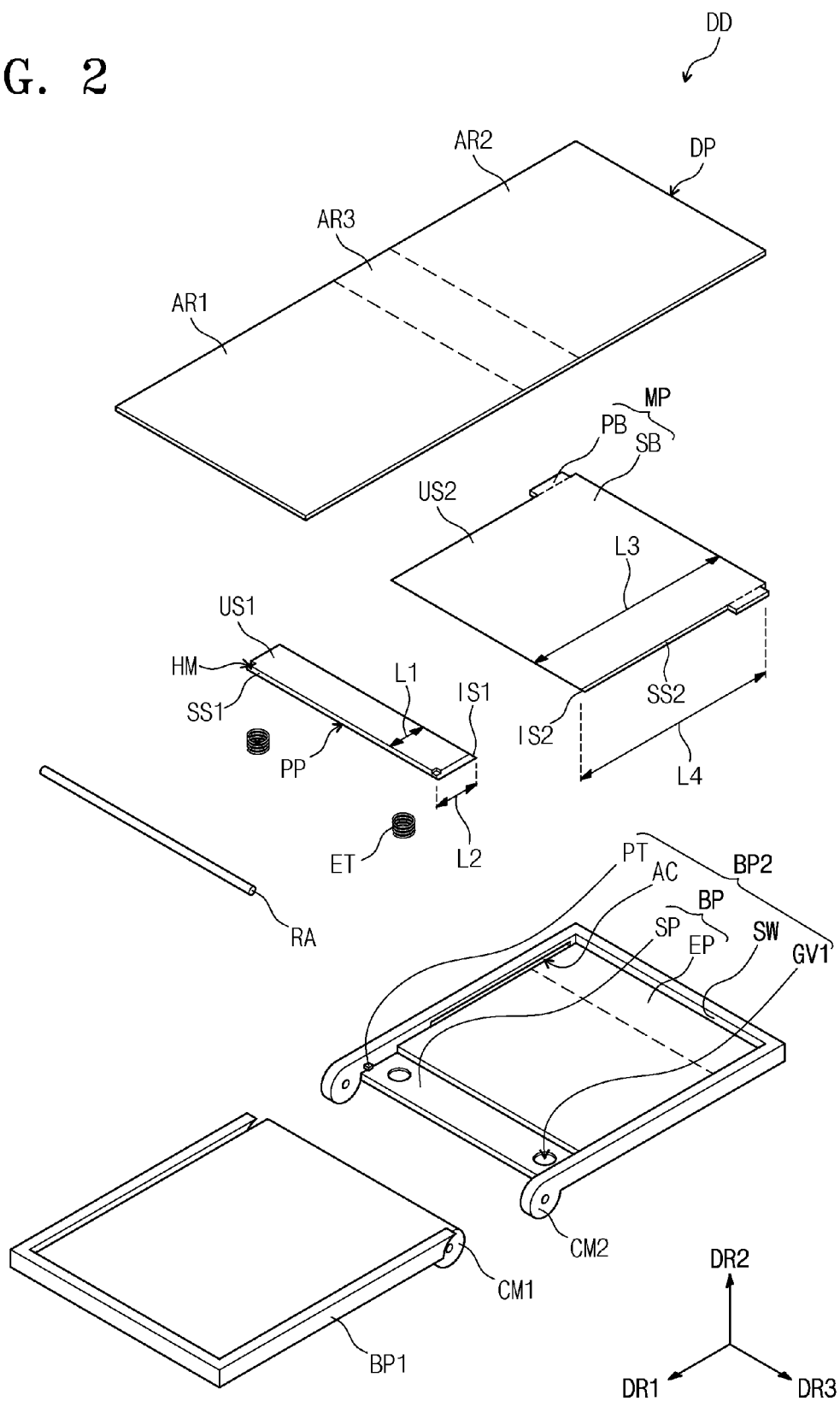
FIG. 2 is an exploded perspective view showing the display apparatus shown in FIG. 1.

The display apparatus DD includes a display panel DP, a first base plate BP1, a second base plate BP2, a moving plate MP (refer to FIG. 2), and a pop-up plate PP (refer to FIG. 2).

The display panel DP displays an image in response to signals applied thereto. Hereinafter, an organic light emitting display panel will be described as the display panel DP, but the display panel DP should not be limited to the organic light emitting display panel as long as the display panel DP has flexibility.

The display panel DP may be flexible. Accordingly, a base substrate included in the display panel DP may be a flexible substrate and include a plastic material having superior heat resistance and durability, such as polyethylene etherphthalate, polyethylene naphthalate, polycarbonate, polyarylate, polyetherimide, polyethersulfone, polyimide, etc, but embodiments of the present invention are not limited thereto or thereby. For example, the base substrate may be a film, which is not damaged even though the base substrate is curved (e.g., a film that is not damaged when it is bent or flexed).

The display panel DP includes a first electrode, a second electrode, and an organic layer. The first electrode is an anode electrode (a positive electrode). The first electrode generates holes. The second electrode is a cathode electrode (a negative electrode). The second electrode generates electrons. The organic layer includes a plurality of layers and includes an organic material. The organic layer includes an organic light emitting layer including a low molecular weight or high molecular weight organic material. The holes and the electrons are injected into the organic light emitting layer from the first and second electrodes, respectively, and are recombined in the organic light emitting layer to generate excitons, and the organic light emitting display panel emits a light by the excitons that return to a ground state from an excited state.

According to one embodiment of the present invention, the display apparatus DD may further include a touch sensing unit disposed on the display panel DP. The touch sensing unit may be classified as a resistive film type, an electrostatic capacitive type, and an electromagnetic induction type depending on its operational principle. In the case where the touch sensing unit is the electrostatic capacitive type touch sensing unit, the touch sensing unit includes two kinds of sensors crossing each other. The electrostatic capacitive type touch sensing unit obtains coordinate information in a self-capacitance scheme or a mutual capacitance scheme.

The first base plate BP1 and the second base plate BP2 are coupled to each other such that the first and second base plates BP1 and BP2 rotate with respect to each other. In a case where at least one of the first and second base plates BP1 and BP2 rotates, the display panel DP is folded with respect to (e.g., along) a folding axis Fx.

Figure 3:
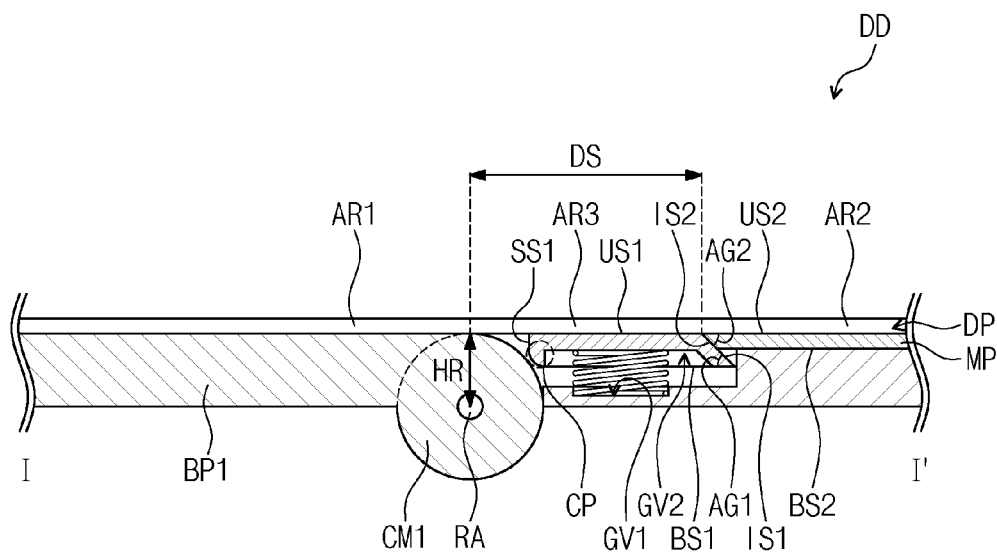
FIG. 3 is a cross-sectional view taken along a line I-I' of FIG. 1.

FIG. 2 is an exploded perspective view showing the display apparatus shown in FIG. 1 and FIG. 3 is a cross-sectional view taken along a line I-I' of FIG. 1.

Referring to FIGS. 2 and 3, the display panel DP includes a first portion AR1, a second portion AR2, and a third portion AR3. The first portion AR1 is spaced apart from the second portion A2 in or along a first direction DR1. The third portion AR3 is between the first portion AR1 and the second portion AR2.

When the display panel DP is folded, the first and second portions AR1 and AR2 are not folded (or not bent) and the third portion AR3 is folded (or bent). In some embodiments, display panel DP may have flexibility over the entire area thereof or, in other embodiments, only the folded third portion AR3 may have flexibility.

The first portion AR1 of the display panel DP is coupled to the first base plate BP1 and the second portion AR2 of the display panel DP is coupled to the moving plate MP. The pop-up plate PP supports the third portion AR3 of the display panel DP when the display panel DP is in a flat state. The second base plate BP2 is coupled to the first base plate BP1 to allow the second base plate BP2 to be rotatable relative to the first base plate BP1, and the second base plate BP2 is slide-coupled to the moving plate MP.

The second base plate BP2 includes a bottom portion BP and a sidewall portion SW. The moving plate MP and the pop-up plate PP are disposed on the bottom portion BP. The sidewall portion SW extends from the bottom portion BP along a second direction DR2.

The bottom portion BP is provided with a stepped portion SP on which the pop-up plate PP is disposed and an exposure portion EP exposed when the moving plate MP moves. The stepped portion SP has a thickness thinner than that of a portion of the bottom portion BP on which the moving plate MP slides. When the moving plate MP slides, the pop-up plate PP is easily inserted into the stepped portion SP under the moving plate MP.

The moving plate MP slides with respect to the second base plate BP2 along the first direction DR1. The moving plate MP includes a base portion SB and a wing portion PB. The base portion SB is coupled to the second portion AR2. The wing portion PB protrudes from side surfaces spaced apart from each other along a third direction DR3 crossing the first direction DR1. The sidewall portion SW of the second base plate BP2 includes an accommodating portion AC formed therein to accommodate the wing portion PB.

In the present example embodiment, the wing portion PB protrudes from the side surfaces of the base portion SB, but embodiments of the present invention are not be limited thereto or thereby. For instance, in one embodiment, the second base plate BP2 and the moving plate MP are coupled to each other such that the second base plate BP2 and the moving plate MP slide with respect to each other. According to another embodiment, a wing portion may protrude from an inner surface of the sidewall portion SW and the base portion BS may include an accommodating portion formed therein to accommodate the wing portion. According to another embodiment, the wing portion may protrude from a bottom surface of the base portion SB and the second base plate BP2 may include an accommodating portion formed therein to accommodate the wing portion.

The pop-up plate PP is disposed on the stepped portion SP. The pop-up plate PP is configured to move along the second direction DR2 corresponding to a thickness direction of the second base plate BP2. For instance, when the moving plate MP slides along the first direction DR1, the pop-up plate PP rises up or falls down along the second direction DR2.

The moving plate MP may further include a protrusion portion PT protruding from an inner surface of the sidewall portion SW. The protrusion portion PT may protrude from an inner surface of the sidewall portion SW adjacent to the pop-up plate PP. The protrusion portion PT controls the rising of the pop-up plate PP along the second direction DR2.

The pop-up plate PP includes a first upper surface US1, a first bottom surface BS1, three first side surfaces SS1, and a first inclined surface IS1.

A width of the first upper surface US1, which is substantially parallel to the first direction DR1, has a first length L1 along the first direction DR1. The first upper surface US1 makes contact with the third portion AR3 of the display panel DP when the display panel DP is in the flat state. The first bottom surface BS1 faces away from the first upper surface US1. A width of the first bottom surface BS1, which is substantially parallel to the first direction DR1, has a second length L2 along the first direction DR1. The second length L2 is greater than the first length L1. A cross-section of the pop-up plate PP, which is substantially parallel to a plane surface defined by the first and second directions DR1 and DR2, has a substantially trapezoidal shape.

Each of the first side surfaces SS1 connects the first upper surface US1 to the first bottom surface BS1. Each of the first side surfaces SS1 is substantially perpendicular to the first upper surface US1. The first inclined surface IS1 connects the first upper surface US1 to the first bottom surface BS1. Because the width in the first direction DR1 of the first upper surface US1 is different from the width in the first direction DR1 of the first bottom surface BS1, the first inclined surface IS1 is not perpendicular to the first upper surface US1. A first angle AG1 between the first bottom surface BS1 and the first inclined surface IS1 may be an acute angle smaller than 90 degrees (and an angle between the first top surface US1 and the first inclined surface IS1 may be an obtuse angle larger than 90 degrees).

A corner portion CP, at which one side surface facing the first inclined surface IS1 among the first side surfaces SS1 is connected to the first bottom surface BS1, may have a round (or rounded) shape. When the pop-up plate PP rises up or falls down along the second direction DR2, friction and interference between the pop-up plate PP and a coupling portion CM1 may be reduced due to the round shape.

An elastic member ET is disposed between the pop-up plate PP and the stepped portion SP. The elastic member ET may be a spring, a silicon rubber, a natural rubber, or a synthetic rubber. The material for the elastic member ET is not limited to a specific material as long as the elastic member ET is compressed when an external force is applied to the elastic member ET and returns its original shape when the external force is removed.

The stepped portion SP may include a first groove GV1 formed therein to accommodate the elastic member ET. The elastic member ET may be more stably fixed by the first groove GV1. In the present example embodiment, the first groove GV1 has a substantially circular shape, but embodiments of the present invention are not limited thereto or thereby. For instance, the first groove GV1 may have a shape that is deformed depending on the shape of the elastic member ET. When the elastic member ET has a substantially rectangular shape of silicon rubber, the first groove GV1 has a substantially rectangular shape.

The pop-up plate PP may include a second groove GV2 formed in the first bottom surface BS1 to accommodate the elastic member ET. In the present example embodiment, the second groove GV2 may have substantially the same shape as an external shape of the pop-up plate PP. For example, an inner portion of the pop-up plate PP may be hollow. When the second groove GV2 is formed in the first bottom surface BS1 of the pop-up plate PP, a weight of the display apparatus DD may be reduced. As another way, the second groove GV2 may have a shape corresponding to that of the elastic member ET. In addition, at least one of the first groove GV1 and the second groove GV2 may be omitted according to embodiments.

The first upper surface US1 of the pop-up plate PP may include a recess HM formed therein to accommodate the protrusion portion PT of the second base plate BP2. In the present example embodiment, the recess HM is provided at two corners of the first upper surface US1, but embodiments of the present invention are not limited thereto or thereby. When the pop-up plate PP rises up in the second direction DR2, the protrusion portion PT is accommodated in the recess HM, and thus the rising of the pop-up plate PP in the second direction DR2 is controlled. Accordingly, the third portion AR3 may be prevented from being separated by the pop-up plate PP when the display panel DP is in the flat state.

The moving plate MP includes a second upper surface US2, a second bottom surface BS2, three second side surfaces SS2, and a second inclined surface IS2.

A width of the second upper surface US2, which is substantially parallel to the first direction DR1, has a third length L3 along the first direction DR1. The second upper surface US2 is coupled to the second portion AR2 of the display panel DP. The second bottom surface BS2 faces the second upper surface US2. A width of the second bottom surface BS2, which is substantially parallel to the first direction DR1, has a fourth length L4 along the first direction DR1. The fourth length L4 is smaller than the third length L3. A cross-section of the moving plate MP, which is substantially parallel to a plane surface defined by the first and second directions DR1 and DR2, has a substantially trapezoidal shape.

Each of the second side surfaces SS2 connects the second upper surface US2 and the second bottom surface BS2. Each of the second side surfaces SS2 is substantially perpendicular to the second upper surface US2. The second inclined surface IS2 connects the second upper surface US2 and the second bottom surface BS2. Because the width in the first direction DR1 of the second upper surface US2 is different from the width in the first direction DR1 of the second bottom surface BS2, the second inclined surface IS2 is not perpendicular to the second upper surface US2. A second angle AG2 between the second upper surface US2 and the second inclined surface IS2 may be an acute angle smaller than 90 degrees (and the angle between the second bottom surface BS2 and the second inclined surface may be an obtuse angle greater than 90 degrees).

The first angle AG1 may be substantially the same as the second angle AG2. The first inclined surface IS1 makes contact with the second inclined surface IS2 when the display panel DP is in the flat state. In some embodiments of the present invention, at least one of the first and second inclined surfaces IS1 and IS2 may include a member to reduce friction, which is attached thereto.

The first base plate BP1 and the second base plate BP2 are coupled to each other such that the first base plate BP1 and the second base plate BP2 rotate with respect to each other. The first base plate BP1 includes the first coupling portion CM1 and the second base plate BP2 includes a second coupling portion CM2. The first coupling portion CM1 and the second coupling portion CM2 are coupled to each other by a rotation axis RA (or hinge).

In the present example embodiment, the rotation axis RA is coupled to the second coupling portion CM2 after penetrating through the first coupling portion CM1, but embodiments of the present invention are not limited thereto or thereby. For instance, a protrusion is provided at one surface of surfaces of the first and second coupling portions CM1 and CM2, which make contact with each other, and a recess is provided at the other surface of the surfaces of the first and second coupling portions CM1 and CM2. Therefore, the first and second coupling portions CM1 and CM2 are coupled to each other.

The first coupling portion CM1 may have a substantially cylindrical shape elongated along the third direction DR3. The second coupling portion CM2 is coupled to both ends of the first coupling portion CM1, which are spaced apart from each other along the third direction DR3. When the display panel DP is folded, the third portion AR3 is wound around the first coupling portion CM1. A length DS of the third portion AR3 is equal to or greater than a value obtained by multiplying a radius HR of the first coupling portion CM1 by pi ($\pi$).

The third portion AR3 is wound around the first coupling portion CM1 and the moving plate MP slides toward the rotation axis RA. The moving plate MP pushes out the pop-up plate PP, and thus the pop-up plate PP falls along the second direction DR2. Thus, the pop-up plate PP is inserted into or slid under the moving plate MP and the moving plate MP slides to be adjacent to the first coupling portion CM1. Although the third portion AR3 is wound around the first coupling portion CM1, a stress applied to the display panel DP is reduced by the movement of the pop-up plate PP and the moving plate MP.

Figure 4:
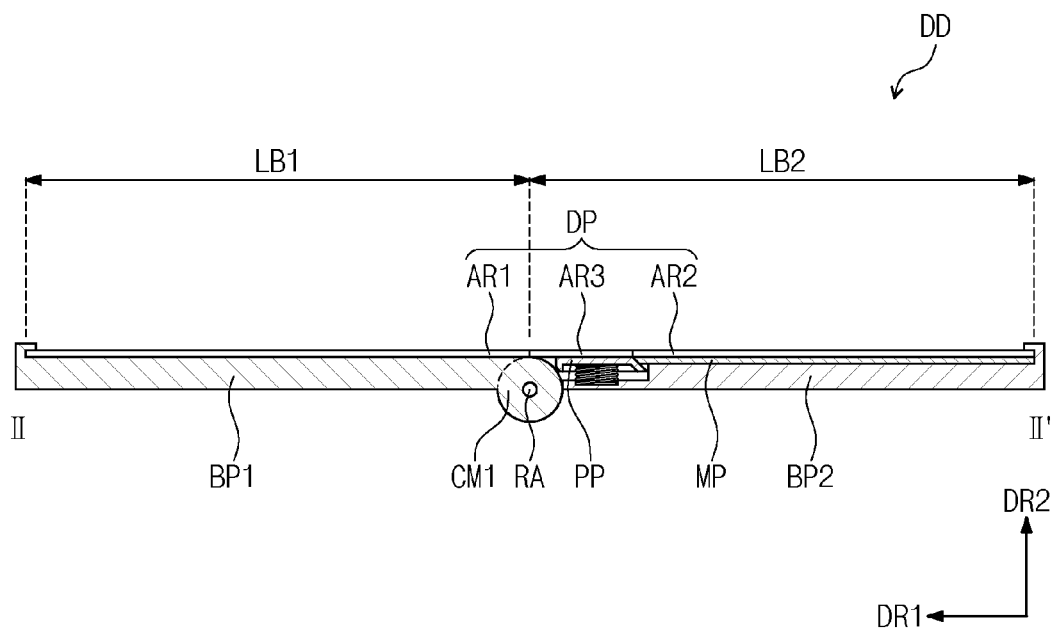
FIG. 4 is a cross-sectional view taken along a line II-II' of FIG. 1 when a display apparatus is in a first state according to an example embodiment of the present invention.

FIG. 4 is a cross-sectional view taken along a line II-II' of FIG. 1 when the display apparatus DD is in a first state according to an example embodiment of the present invention.

Referring to FIGS. 3 and 4, when the display panel DP is in the first state, a rotation angle of the second base plate BP2 is about zero (0). During the first state, the first inclined surface IS1 of the pop-up plate PP and the second inclined surface IS2 of the moving plate MP are maintained in a contact state.

The pop-up plate PP supports the third portion AR3 of the display panel DP. For example, because the hollow space under the third portion AR3 is supported by the pop-up plate PP in the first state, the third portion AR3 may be prevented from being damaged even though an external force is applied to the third portion AR3.

Hereinafter, a length of a first section of the first base plate BP1 is referred to as a first length LB1. The first section corresponds to a section in which the first base plate BP1 is overlapped with the first portion AR1 when the display panel DP is in the first state. The first length LB1 may be substantially the same as the length in the first direction DR1 of the first portion AR1.

A length of a second section of the second base plate BP2 is referred to as a second length LB2. The second section corresponds to a section in which the second base plate BP2 is overlapped with the second and third portions AR2 and AR3 when the display panel DP is in the first state. The second length LB2 may be substantially the same as the length obtained by adding the length in the first direction DR1 of the second portion AR2 and the length in the first direction DR1 of the third portion AR3.

In the first state, the first upper surface US1 of the pop-up plate PP and the second upper surface US2 of the moving plate MP may be located at the same plane surface. The pop-up plate PP may be prevented or blocked from rising higher than the moving plate MP by the protrusion PT shown in FIG. 2. Accordingly, the third portion AR3 of the display panel DP may be prevented or blocked from protruding in the first state.

Figure 5:
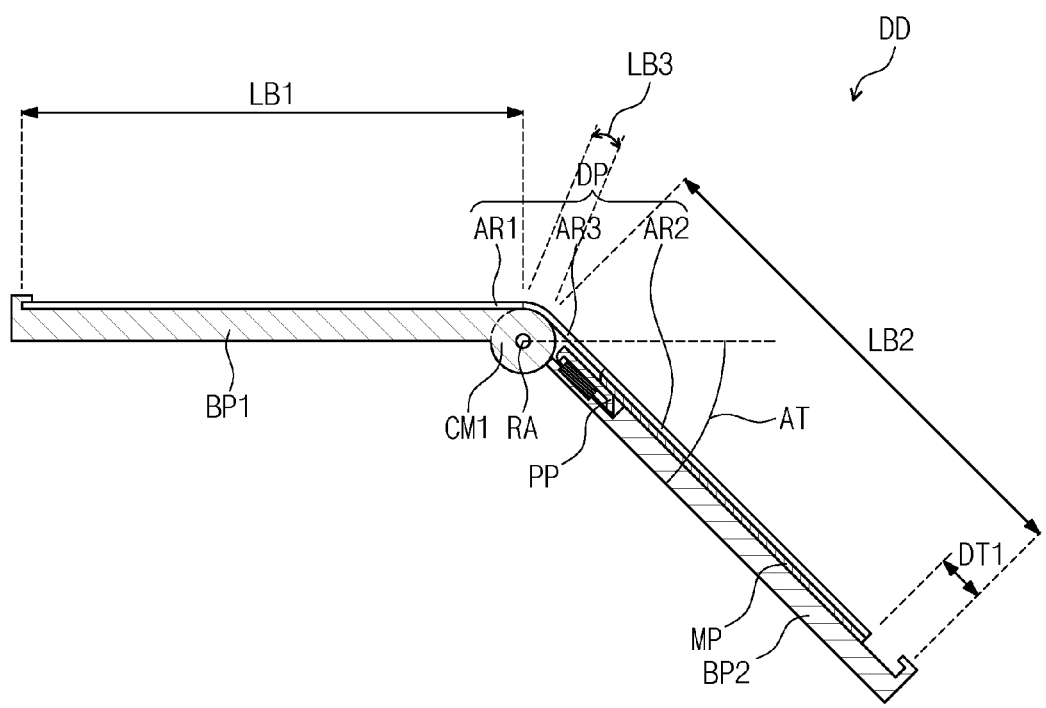
FIG. 5 is a cross-sectional view showing a state of a display apparatus, which is changed to a second state from a first state, according to an example embodiment of the present invention.
Figure 6:
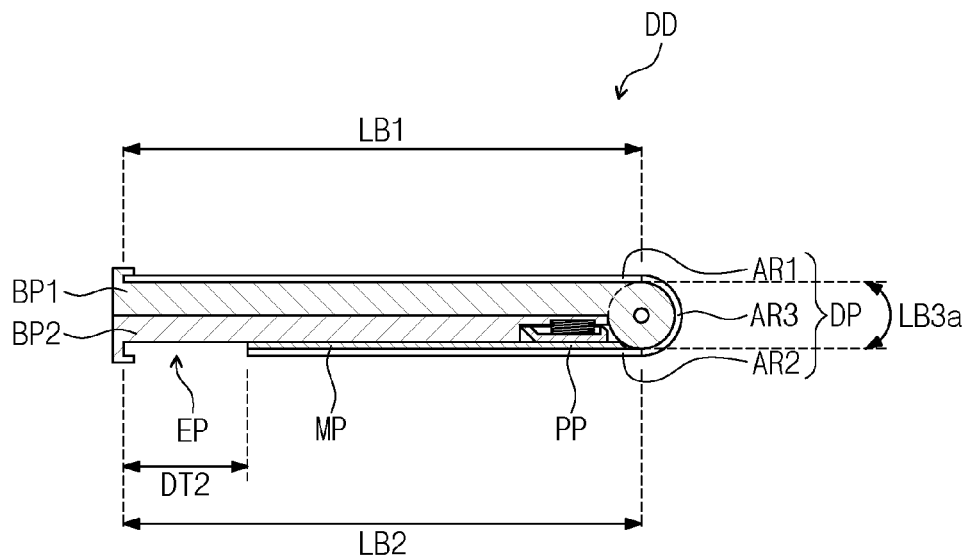
FIG. 6 is a cross-sectional view showing a display apparatus in a second state according to an example embodiment of the present invention.

FIG. 5 is a cross-sectional view showing a state of a display apparatus, which is changed to a second state from a first state, according to an example embodiment of the present invention and FIG. 6 is a cross-sectional view showing a display apparatus in a second state according to an example embodiment of the present invention.

Referring to FIGS. 5 and 6, the second base plate BP2 may be rotated relative to the first base plate BP1. Hereinafter, a state in which the rotation angle of the second base plate BP2 is about 180 degrees as shown in FIG. 6 is referred to as a second state. In this case, the display panel DP is folded.

In the present example embodiment, the display apparatus DD may be outwardly folded when the second base plate BP2 rotates in a clockwise direction in the first state. In the case where the display apparatus DD is outwardly folded, a display area of the display panel DP faces toward outside even though the display panel DP is in the second state. Therefore, a user may view the image displayed on the display panel DP even though the display panel DP is folded.

FIG. 5 shows the case that the rotation angle of the second base plate BP2 is a first angle AT. When the second base plate BP2 rotates by the first angle AT, a third section is further provided between the first and second sections. The third section corresponds to a portion of the first coupling portion CM1, which makes contact with the display panel DP.

A third length LB3 of the third section may be substantially the same as a value CCP, which is obtained by the following Equation 1. HR is the radius of the first coupling portion CM1, and AT is the rotation angle of the second base plate BP2.

$$CCP = 2\pi \times HR \times \frac{AT}{360} \quad \text{Equation 1}$$

The length of the display panel DP may be substantially equal to a sum of the first length LB1 of the first section and the second length LB2 of the second section. In the case where the third section is further provided between the first and second sections according to the rotation of the second base plate BP2, a portion of the third portion AR3 of the display panel DP is wound around the third section. Because the third section is further provided, the moving plate MP slides with respect to the second base plate BP2 along a direction toward the second base plate BP2.

The moving plate MP slides by a first distance DT1. The first distance DT1 may be substantially the same as the third length LB3. When the second base plate BP2 rotates, the moving plate MP slides. Accordingly, the stress applied to the display panel DP may be reduced by the third section.

The moving plate MP applies force or pressure to the pop-up plate PP while sliding and the pop-up plate PP falls or moves down (or is pressed down) along the second direction DR2 corresponding to the thickness direction of the second base plate BP2. In the first state, the first inclined surface IS1 of the pop-up plate PP is inclined with respect to and makes contact with the second inclined surface IS2 of the moving plate MP. Therefore, the pop-up plate PP falls down along the second direction DR2 by the pushing force of the moving plate MP.

The moving plate MP has a first strength and the pop-up plate PP has a second strength. The first strength is greater than the second strength. The moving plate MP includes a stainless steel or a reinforced plastic, and the pop-up plate PP includes a plastic material having the strength weaker than that of the stainless steel or the reinforced plastic. When the first strength is greater than the second strength, the pushing force caused by the moving plate MP and applied to the pop-up plate PP may be greater than the pushing force caused by the pop-up plate PP and applied to the moving plate MP. As a result, the pop-up plate PP moves relatively easily. However, according to some embodiments, the moving plate MP and the pop-up plate PP may include the same material as each other.

According to a comparative example, in the case where the moving plate MP does not slide, the display panel DP is stretched by the length of the third section. As a result, a tensile force occurs in the display panel DP and components included in the display panel DP may be damaged. However, according to the present example embodiment, the display panel DP is not stretched by the third length LB3 of the third section even though the third length LB3 of the third section is changed. For instance, the moving plate MP slides by the third length LB3 of the third section and the second portion AR2 moves to correspond to the wound length of the display panel DP. Accordingly, the tensile force occurring in the display panel DP may be reduced, and thus the stress applied to the display panel DP when the display panel DP is folded may be reduced. In addition, because the pop-up plate PP supports the third portion AR3 when the display panel DP is in the first state, the third portion AR3 may be protected from being damaged due to the external force.

FIG. 6 shows the case that the second base plate BP2 rotates by about 180 degrees. A third distance LB3a between the first and second sections may be substantially equal to a value obtained by multiplying the radius HR of the first coupling portion CM1 by the pi ($\pi$). For example, the length of the third portion AR3 of the display panel DP wound around the third section may be substantially equal to the value obtained by multiplying the radius HR of the first coupling portion CM1 by pi ($\pi$).

The moving plate MP slides by the third length LB3a of the third section provided between the first and second sections. A distance DT2 along which the moving plate MP slides may be substantially the same as the third length LB3a.

When the second base plate BP2 rotates in a counter-clockwise direction, the state of the display panel DP is changed to the first state from the second state. In the case where the state of the display panel DP is changed to the first state from the second state, the moving plate MP slides in a direction away from the rotation axis RA.

Because the display panel DP tends to return to its original shape by a restoration force when the state of the display panel DP is changed to the first state, the moving plate MP slides to the direction far away from the rotation axis RA. Therefore, a separate elastic member for restoring the position of the moving plate MP may be omitted.

Figure 7:
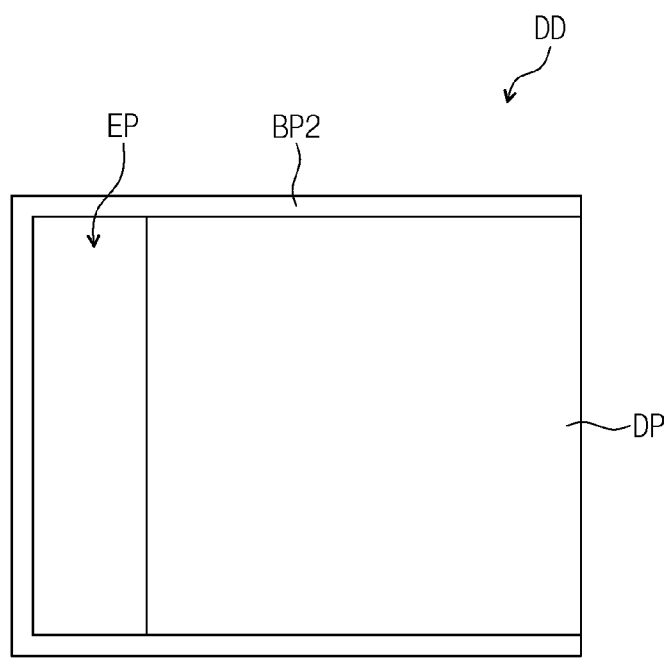
FIG. 7 is a plan view showing a display apparatus in a second state according to an example embodiment of the present invention.

FIG. 7 is a plan view showing the display apparatus DD in the second state according to an example embodiment of the present invention.

Referring to FIG. 7, the moving plate MP (refer to FIG. 6) slides when the display panel DP is folded, and thus the exposure portion EP of the second base plate BP2 is exposed to the outside.

According to the present example embodiment, a variety of members may be disposed on the exposure portion EP. For instance, a pattern (e.g., a predetermined pattern) may be printed on the exposure portion EP or a film printed with a pattern (e.g., a predetermined pattern) may be attached to the exposure portion EP, but embodiments of the present invention are not limited thereto or thereby. In addition, in some embodiments of the present invention, a sub-display panel may be disposed on the exposure portion EP according to another embodiment. The sub-display panel may be exposed to the outside when the second base plate BP2 rotates.

Figure 8:
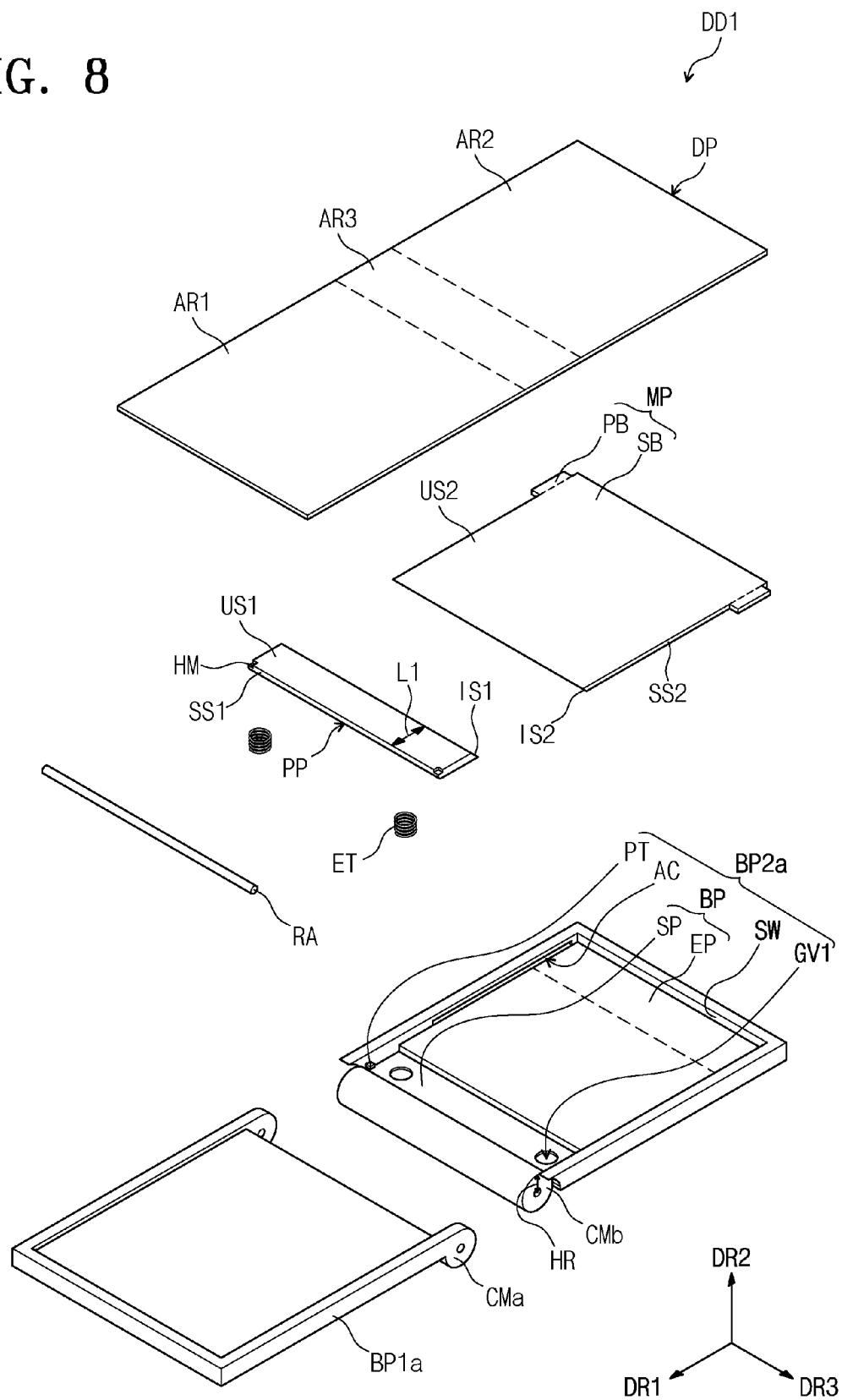
FIG. 8 is an exploded perspective view showing a display apparatus according to an example embodiment of the present invention.

FIG. 8 is an exploded perspective view showing a display apparatus DD1 according to an example embodiment of the present invention.

Referring to FIG. 8, the display apparatus DD1 have the same structure and function as those of the display apparatus DD shown in FIG. 2 except for a first base plate BP1a and a second base plate BP2a.

The first base plate BP1a includes a first coupling portion CM1a and the second base plate BP2a includes a second coupling portion CM2a. The first coupling portion BP1a is coupled to the second coupling portion BP2a by a rotation axis RA.

The second coupling portion CMb has a substantially cylindrical shape elongated in the third direction DR3. The first coupling portion CMa is coupled to both ends of the second coupling portion CMb, which are spaced apart from each other. When the second base plate BP2a rotates, the third portion AR3 of the display panel DP is wound around the second coupling portion CMb.

A first surface US1 of the pop-up plate PP has a first length L1. In the present example embodiment, the first length L1 is equal to or greater than a value obtained by multiplying a shortest distance HR between the display panel DP and the rotation axis RA by pi ($\pi$). Accordingly, the moving plate MP may slide by the third section elongated when the third portion AR3 of the display panel DP is wound around the second coupling portion CMb.

Although the example embodiments of the present invention have been described, it is understood that the present invention should not be limited to these example embodiments but various changes and modifications can be made by one ordinary skilled in the art within the spirit and scope of the present invention as hereinafter claimed.

What is claimed is:

1. A display apparatus comprising:
   a first base plate;
   a second base plate coupled to the first base plate to allow the second base plate to be rotated on the basis of a rotation axis between the first base plate and the second base plate;
   a moving plate coupled to the second base plate and configured to slide along a first direction with respect to the second base plate;
   a pop-up plate configured to move along a second direction corresponding to a thickness direction of the second base plate on the second base plate in accordance with a movement of the moving plate; and
   a display panel comprising a first portion coupled to the first base plate and a second portion coupled to the moving plate;
   wherein the pop-up plate comprises:
   a first upper surface having a width corresponding to a first length along the first direction;
   a first bottom surface facing the first upper surface and having a width corresponding to a second length greater than the first length along the first direction;
   three first side surfaces substantially perpendicular to the first upper surface and connecting the first upper surface and the first bottom surface; and
   a first inclined surface connecting the first upper surface and the first bottom surface.

2. The display apparatus of claim 1, further comprising an elastic member between the pop-up plate and the second base plate.

3. The display apparatus of claim 2, wherein the second base plate comprises a first groove configured to accommodate the elastic member, and
   wherein the pop-up plate comprises a second groove configured to accommodate the elastic member.

4. The display apparatus of claim 1, wherein the moving plate comprises:
   a base portion coupled to the second portion;
   a first wing portion protruding from a first side surface of the base portion; and
   a second wing portion protruding from a second side surface of the base portion, the first wing portion and the second wing portion being spaced apart from each other along a third direction crossing the first direction, and
   wherein the second base plate has an accommodating portion configured to accommodate the wing portion.

5. The display apparatus of claim 1, wherein the first length is equal to or greater than a value obtained by multiplying a shortest distance between the rotation axis and the display panel by pi (r).

6. The display apparatus of claim 1, wherein the moving plate comprises:
   a second upper surface coupled to the second portion and having a width corresponding to a third length along the first direction;
   a second bottom surface facing the second upper surface and having a width corresponding to a fourth length smaller than the third length along the first direction;
   three second side surfaces substantially perpendicular to the second upper surface and connecting the second upper surface and the second bottom surface; and
   a second inclined surface connecting the second upper surface and the second bottom surface, and a first angle between the first inclined surface and the first bottom surface is substantially equal to a second angle between the second inclined surface and the second upper surface.

7. The display apparatus of claim 1, wherein a corner at which one side surface among the first side surfaces, which faces the first inclined surface, is connected to the first bottom surface has a round shape.

8. The display apparatus of claim 1, wherein the second base plate comprises:
   a bottom portion, the pop-up plate and the moving plate being on the bottom portion; and
   a sidewall portion extending in the second direction from the bottom portion, the bottom portion comprising a stepped portion defined therein to accommodate the pop-up plate.

9. The display apparatus of claim 8, wherein the second base plate further comprises a protrusion portion protruding from an inner surface of the sidewall portion and the first upper surface of the pop-up plate comprises a recess formed therein to accommodate the protrusion portion.

10. The display apparatus of claim 8, wherein the bottom portion comprises an exposure portion that is exposed when the moving plate moves when the second base plate rotates.

11. The display apparatus of claim 1, wherein one base plate of the first and second base plates has a substantially cylindrical shape elongated in a third direction crossing the first direction, the other base plate of the first and second base plates comprises a second coupling portion coupled to both ends of the first coupling portion, which are spaced apart from each other in the third direction, and a third portion of the display panel, which is defined between the first and second portions, is wound around the first coupling portion in accordance with a rotation of the second base plate.

12. The display apparatus of claim 1, wherein the moving plate has a first strength and the pop-up plate has a second strength smaller than the first strength.

13. The display apparatus of claim 1, wherein, when a case that a rotation angle of the second base plate is 0 and the display panel is flat is referred to as a first state and a case that the rotation angle of the second base plate is 180 and the display panel is folded is referred to as a second state, the moving plate slides toward the rotation axis while the second base plate rotates from the first state to the second state.

14. The display apparatus of claim 13, wherein the pop-up plate is pressed down and the moving plate slides above the pop-up plate while the second base plate rotates to the second state from the first state.

15. A portable terminal comprising:
   a display panel deformed from one state to another state among a first state in which the display panel is flat and a second state in which the display panel is folded;
   a first base plate coupled to a first portion of the display panel;
   a moving plate directly coupled to a second portion of the display panel, the second portion being spaced apart from the first portion along a first direction;
   a pop-up plate configured to support a third portion of the display panel when the display panel is in the first state, the third portion of the display panel being between the first and second portions; and
   a second base plate coupled to the first base plate and configured to be rotated relative to the first base plate, the second base plate being sliding-coupled to the moving plate and configured to accommodate the pop-up plate.

16. The portable terminal of claim 15, wherein the moving plate is configured slide toward the pop-up plate and the pop-up plate is configured to be accommodated in the second base plate by the moving plate when the state of the display panel is changed from the first state to the second state.

17. The portable terminal of claim 16, wherein the pop-up plate comprises a first inclined surface contacting a second inclined surface of the moving plate when the display panel is in the first state, the first inclined surface having an incline at a first angle with respect to a bottom surface of the pop-up plate, the second inclined surface having an incline at a second angle with respect to an upper surface of the moving plate, and each of the first and second angles being an acute angle.

18. The portable terminal of claim 15, wherein the pop-up plate is between the moving plate and the second base plate when the display panel is in the second state.

19. The portable terminal of claim 15, wherein the third portion is bent at a first radius of curvature when the display panel is in the second state, and a width in the first direction of the third portion is equal to or greater than a value obtained by multiplying the first radius of curvature by pi ($\pi$) when the display panel is in the first state.

* * * * *